(12) United States Patent
Lee et al.

(10) Patent No.: US 6,507,224 B1
(45) Date of Patent: Jan. 14, 2003

(54) HIGH SPEED INPUT RECEIVER FOR GENERATING PULSE SIGNAL

(75) Inventors: Jong Cheol Lee, Seoul (KR); Yong Jin Yoon, Seoul (KR); Kwang Jin Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/038,171

(22) Filed: Jan. 3, 2002

(30) Foreign Application Priority Data

Jul. 4, 2001 (KR) ........................................ 2001-39701

(51) Int. Cl.[7] .............................................. G11C 27/02
(52) U.S. Cl. .............................. 327/91; 327/57; 327/77; 327/212
(58) Field of Search ................................ 327/51–57, 77, 327/91, 94, 96, 211, 212, 213, 560–563; 365/203

(56) References Cited

U.S. PATENT DOCUMENTS 5,343,428 A * 8/1994 Pilo et al. ...................... 327/52
5,497,115 A * 3/1996 Millar et al. ................. 327/211
6,147,514 A * 11/2000 Shiratake ...................... 327/55
6,150,851 A * 11/2000 Ohmi et al. .................. 327/91

\* cited by examiner

*Primary Examiner*—Toan Tran
(74) *Attorney, Agent, or Firm*—F. Chau & Associates, LLP

(57) ABSTRACT

An input receiver capable of sensing and amplifying an external signal having a very small swing input signal. The input receiver comprises a clock sampled amplifier for receiving a clock signal and a reference signal, respectively, in response to a first state of a clock signal and a delayed sampling clock signal, and for amplifying and sampling the voltage difference between the external signal and the reference signal, respectively, in response to a transition of the clock and delayed sampling clock signals to a second state; and a pulse generator for pre-charging a power source voltage and selectively pulling down the pre-charged signals to produce a pulse signal, in response to the second state of the delayed sampling clock signal and outputs of the clock sampled amplifier.

12 Claims, 3 Drawing Sheets

HIGH SPEED INPUT RECEIVER FOR GENERATING PULSE SIGNAL

BACKGROUND

1. Technical Field

The present invention relates to an input receiver, and more particularly, an input receiver capable of converting an external signal to an internal signal of pulse type.

2. Description of Related Art

High-speed semiconductor devices receive an external data through circuits such as a buffer circuit or a latch circuit, etc., to maintain the level of the external data after a sampling operation. Only when such buffering and latching operations are accurately performed, it is assumed that the external data were correctly sampled. Accordingly, high-speed semiconductor devices must quickly perform a series of operations, for example, a buffering operation, a latching operation, and a converting operation of an external signal to generate a desired internal signal. The fast operations can improve an operation frequency of the semiconductor devices.

For instance, digital circuits such as high-speed semiconductor devices buffer an external signal and latch the buffered signal by clocking at a rising edge or a falling edge of a clock pulse to receive an external signal. In particular, input receivers of semiconductor devices receive an external signal and transmit the signal through a pair of data transmission lines TSL/CSL (True Signal Line/Complement Signal Line) by generating and loading pulse type signals of different phases on the transmission lines. Then, the input receivers sample the external signal by using a clock pulse to output a pulse-type internal signal having the same width as the clock pulse.

FIG. 1 is a circuit diagram of a conventional input receiver. Referring to FIG. 1, a conventional input receiver comprises a preamplifier 10, an inverter 12, a phase splitter 14, a clocked sampled amplifier 16, and drivers 22, 23.

The preamplifier 10 comprises PMOS transistors 24, 26 for receiving an external signal Vi and a reference signal Vref at their gates, a PMOS transistor 28 connected between a power source voltage Vdd and the PMOS transistors 24, 26, and NMOS transistors 30, 32 connected between the PMOS transistors 24, 26 and a ground voltage. When the external signal Vi and the reference signal Vref are input to the preamplifier 10, the preamplifier 10 compares the signal Vi with the reference signal Vref to amplify the voltage deference between two signals and output a differential amplified signal OUT to the phase splitter 14 through the inverter 12 (which is connected to an output node of the preamplifier 10).

The phase splitter 14 comprises two inverter chains. One inverter chain drives an input signal from the preamplifier 10 to an output terminal, and the other inverter chain inverts a phase of the input signal and drives it to the output terminal. Accordingly, the phase splitter 14 splits the differential amplified signal OUT into two signals OUT and OUTB and provides the signals to the clocked sampled amplifier 16.

The clocked sampled amplifier 16 comprises a clocked latched amplifier 18 and a pre-charge circuit 20. The clocked latched amplifier 18 comprises a NMOS transistor 38 for receiving at its gate an external clock CLK, NMOS transistors 40, 42 for receiving the outputs OUT and OUTB of the phase splitter 14, a latch circuit (which comprises PMOS transistors 44, 46 and NMOS transistors 48, 50) for amplifying the level difference of the signals OUT and OUTB. A pre-charge circuit 20 comprises two PMOS transistors 34, 36, connected between an output node of the clocked latched amplifier 18 and the power source voltage Vdd, for pre-charging an output of the clocked latched amplifier 18 to a level of the power source voltage Vdd to produce output signals OUT_CB and OUT_TB, respectively. The PMOS transistors 34, 36 are switched in response to the external clock CLK.

The clocked sampled amplifier 16 samples the signals OUT and OUTB in response to the external clock CLK to latch and amplify the two signals, and then provides the amplified signals of pulse type OUT_CB and OUT_TB to an internal circuit through the drivers 22, 23. For instance, when the external clock CLK is logic "low", the pre-charge circuit 20 is driven and the outputs of the clocked latched amplifier 18 are pre-charged to the level of the power source voltage Vdd, thereby the output signals OUT_CB, OUT_TB of logic "high" are output from the drivers 22, 23. When the clock CLK transitions from logic "low" to logic "high" in pre-charging the outputs of the clocked latched amplifier 18, the NMOS transistor 38 turns on to enable the clocked latched amplifier 18 and disable the pre-charge circuit 20. At this time, if the output signals OUT and OUTB of the phase splitter 14 is input to the NMOS transistors 40, 42, the level difference of the signals OUT, OUTB is detected and amplified by the latch circuit in the clocked latched amplifier 18 to output the signals OUT_CB and OUT_TB.

As described above, the conventional input receiver shown in FIG. 1 samples an external signal by enabling the clocked latched amplifier 18 in response to an external clock CLK of logic "high", and pre-charges the outputs of the clocked latched amplifier 18 to a level of the power source voltage Vdd by disabling the clocked latched amplifier 18 and driving the pre-charge circuit 20, in response to the clock CLK of logic "low", to output the signals OUT_CB and OUT_TB as a final output signal of pulse type.

However, the conventional input receiver as shown in FIG. 1 has a predetermined delay time from the time of enabling of the clocked latched amplifier 18 to the time of latch operation, while generating output signals of pulse type by using one stage. In addition, the delay time, which is caused during converting the external signal into a true signal and a complement signal in the preamplifier 10 and the phase splitter 14, greatly varies with a level of an external signal. As a result, a high-speed semiconductor device cannot generate a pulse type internal signal from an external signal having a small swing width and high frequency by using the conventional input receiver. Thus, a need exists for an input receiver that reduces an internal operation time of a semiconductor device by quickly sampling an external signal having a decreasing swing amplitude.

SUMMARY OF THE INVENTION

To solve the problems as described above, it is an object of the present invention to provide an input receiver for generating a pulse type internal signal from an external signal having a very small swing.

It is another object of the present invention to provide an input receiver for generating a pulse type internal signal from an external signal having a very small swing voltage in response to a high-speed clock.

It is further object of the present invention to provide an input receiver for sampling and amplifying an external signal in high speed to generate a pair of signals of pulse type.

According to an aspect of the present invention, an input receiver comprises a clock sampled amplifier comprising first and second input/output nodes for receiving an external signal and a reference signal, respectively, in response to a first state of a clock signal and a delayed sampling clock signal, and for amplifying and sampling the voltage difference between the external signal and the reference signal, respectively, in response to a transition of the clock signal and the delayed sampling clock signal to a second state; and a pulse generator comprising first and second output nodes connected between a power source voltage and a ground voltage, for pre-charging the first and second output nodes in response to the first state of the delayed sampling clock signal, and for selectively pulling down one of outputs of the first and second output nodes to a level of the ground voltage to generate a pulse signal, in response to the second state of the delayed sampling clock signal and outputs of the first and second input/output nodes of the clock sampled amplifier.

In one embodiment according to the present invention, the input receiver further comprises a clock generator comprising. The second state of the clock and the delayed sampling clock signals are complementary state of the first state of the clock and the delayed sampling clock signals, respectively.

In one embodiment according to the present invention, the clock sampled amplifier further comprises a latched amplifier, connected between the first and second input/output nodes, for sensing and amplifying the voltage difference between the external signal and the reference signal when the clock signal transitions from the first state to the second state; and first and second pass gates, connected to the first and second input/output nodes, respectively, for receiving the external signal and the reference signal in response to the first state of the delayed sampling clock signal.

In one embodiment according to the present invention, the pulse generator further comprises first and second pre-charge devices, connected between the power source voltage and the first and second output nodes, for pre-charging the first and second output nodes to a level of the power source voltage in response to the first state of the delayed sampling clock signal; a first and second pull-down devices, connected between the first and second input/output nodes in the clock sampled amplifier and the first and second output nodes, for inverting one of the outputs of the first and second output nodes in response to the second state of the delayed sampling clock signal and the outputs of the clock sampled amplifier; and a pull-up amplifier, connected between the first and second output nodes, for pulling up one of the outputs of the first and second output nodes having a higher output voltage.

According to another aspect of the present invention, a method for converting an external signal into an internal signal of pulse type in a semiconductor device is provided. The method comprises the steps of receiving the external signal and a reference signal in response to a first state of a clock signal and a delayed sampling clock signal; amplifying the voltage difference between the external signal and the reference signal to generate two amplified signals in response to a transition of the clock signal to a second state; pre-charging a power source voltage to generate two output signals in response to the first state of the delayed sampling clock signal; and generating a pulse signal by pulling down one of the output signals in response to the amplified signals and a transition of the delayed sampling clock signal to a second state.

Advantageously, a high-speed input receiver of the present invention directly amplifies and samples an external signal without a pre-amplifying operation or a buffer operation. Thus, an input signal can receive an external signal having a small swing level in high speed into a semiconductor device. In addition, because an input receiver does not perform the pre-charging operation, it can amplify an external signal in high speed.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Figure 1:
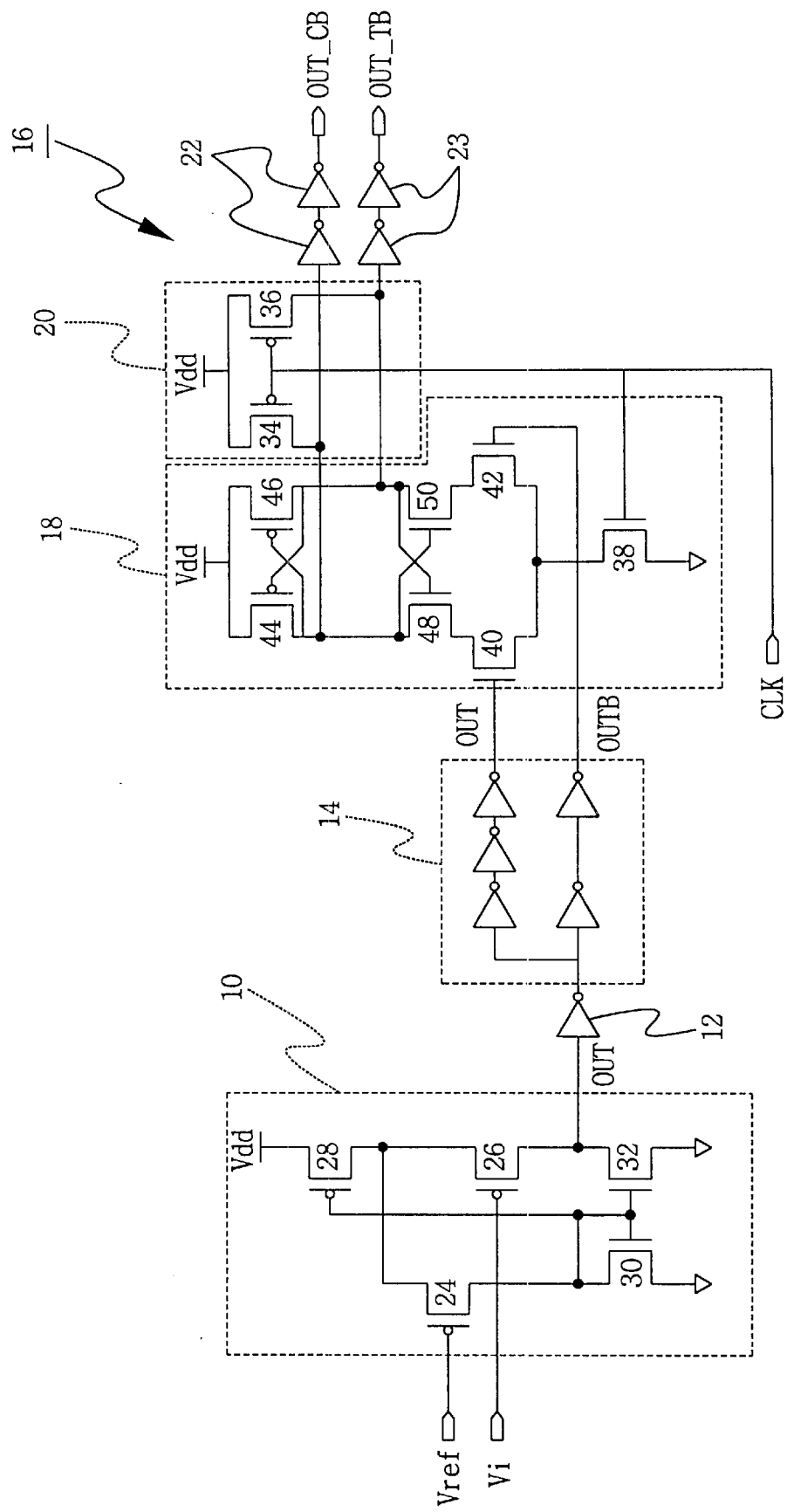
FIG. 1 is a circuit diagram of a conventional input receiver.

In the following description, similar reference numerals are used to denote similar or equivalent parts or portions. Also, in the following description, specifications will be made to provide a thorough understanding of the present invention. It is apparent to one skilled in the art, however, that the present invention can be achieved without such specifications. A detailed description of well-known functions and structures will be omitted so as to clarify key points of the present invention.

Figure 2:
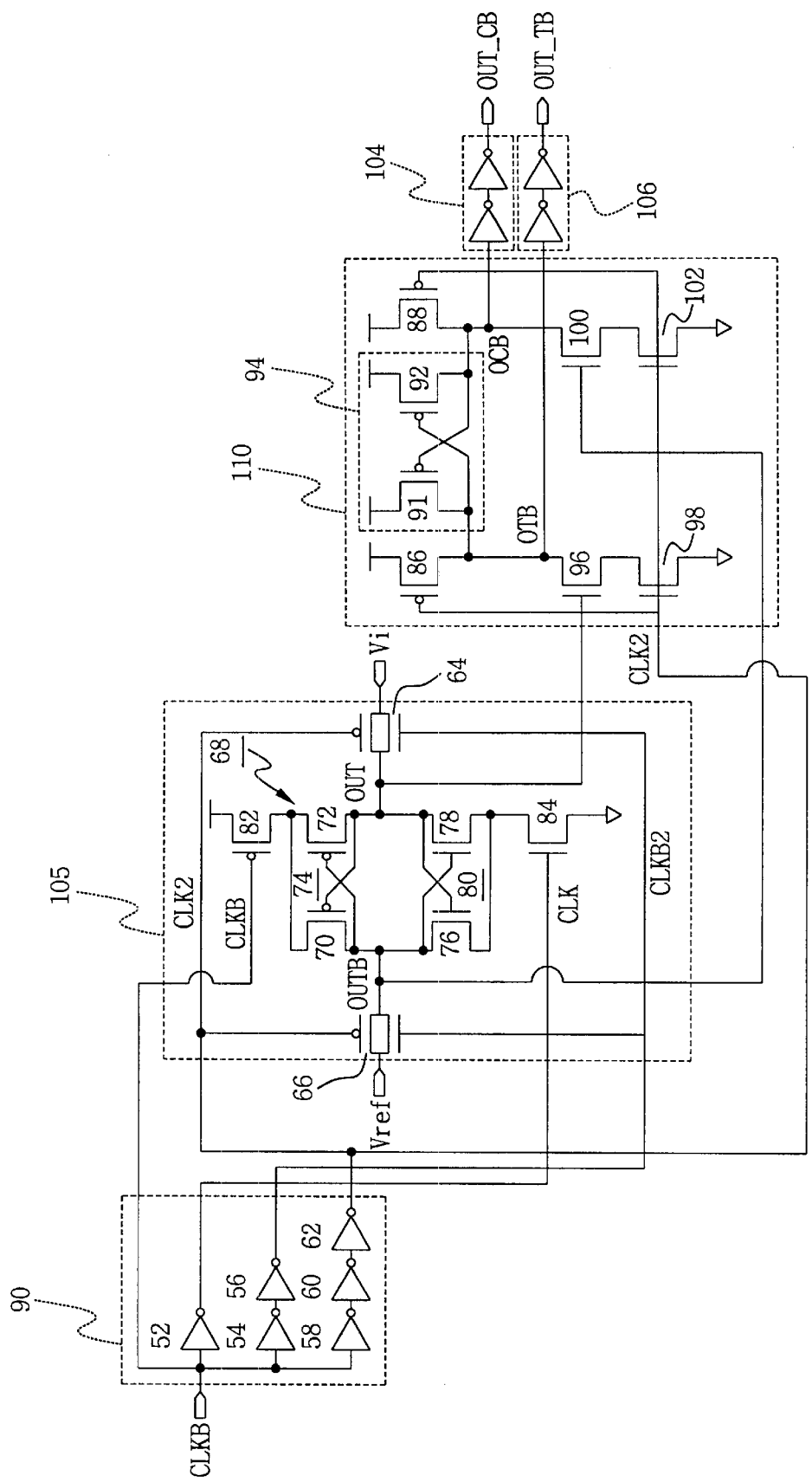
FIG. 2 is a circuit diagram of an input receiver for generating a pulse signal according to an embodiment of the present invention.

FIG. 2 is a circuit diagram of a high-speed input receiver according to an embodiment of the present invention, and FIGS. 3A–3C are waveform diagrams illustrating an operational mode of the input receiver shown in FIG. 2.

Figure 3:
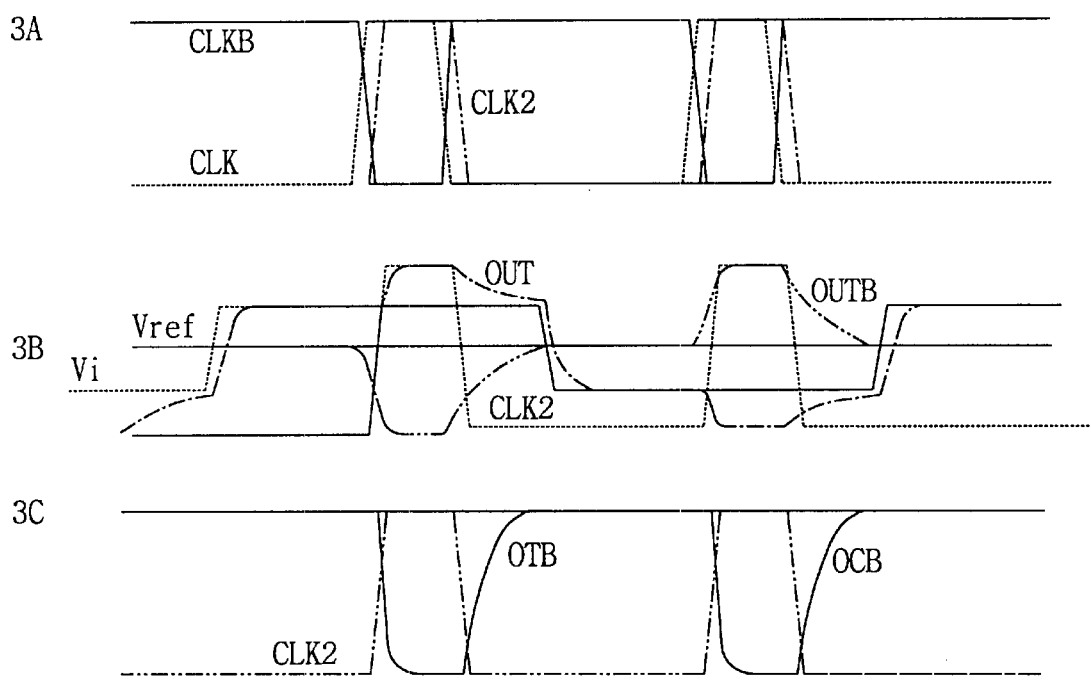
FIGS. 3A–3C are waveform diagrams for illustrating an operational mode of the input receiver shown in FIG. 2.

Referring to FIGS. 2 and 3, an input receiver according to an embodiment of the present invention comprises a timing clock generator 90, a clocked sampled amplifier 105, a clocked pulse generator 110 and drivers 104,106.

The timing clock generator 90 comprises a plurality of inverters for inverting and delaying a main clock CLKB (having a predetermined duty ratio) to generate a complement main clock CLK, a delayed sampling clock CLKB2 and a delayed complement sampling clock CLK2, as shown in FIG. 3A. The generator 90, for example, comprises an inverter 52 for inverting the main clock CLKB to generate the complement main clock CLK, a first inverter chain 54, 56 for delaying the main clock CLKB to generate the delayed sampling clock CLKB2, and a second inverter chain 58–62 for delaying the complement main clock CLK to generate the delayed complement sampling clock CLK2. It is preferable that the driving capacity and the load size of the inverters are properly controlled to prevent delay between the delayed sampling clock CLKB2 and the delayed complement sampling clock CLK2. That is, it is desirable that the phase difference between the delayed sampling clock CLKB2 and the delayed complement sampling clock CLK2 is 180 degree with minimal delay between the two signals so as to generate output signals of pulse type without width change.

The clocked sampled amplifier 105 comprises first and second pass gates 64, 66 for receiving to an external signal Vi and a reference signal Vref, respectively, first and second input/output nodes OUT and OUTB connected to the first and second pass gates 64, 66, respectively, and a latched amplifier 68 connected between the first and second input/output nodes OUT and OUTB.

The latched amplifier 68 comprises a P-type sense amplifier 74 (which comprises two PMOS transistors 70, 72), an N-type sense amplifier 80 (which comprises two NMOS transistors 76, 68), amplification drivers (which comprises a PMOS and NMOS transistors 82, 84). The PMOS transistor 82 connects between the P-type sense amplifier 74 and a power source voltage Vdd and drives the P-type sense amplifier in response to the main clock CLKB. The NMOS transistor 84 connects between the N-type sense amplifier 80 and a ground voltage and drives the N-type sense amplifier in response to the complimentary main clock CLK.

Each pass gate of the first and second pass gates 64, 66 comprises a transmission gate. The transmission gate comprises a PMOS transistor (which receives the delayed sampling clock CLKB2) and a NMOS transistor (which receives the delayed complementary sampling clock CLK2) connected to each other at their channels in parallel.

The clocked pulse generator 110 comprises first and second output nodes OTB and OCB for outputting a pulse-type signal, first and second pre-charging devices (which comprise P-MOS transistors 86, 88) connected between the power source voltage Vdd and the first and second output nodes OTB and OCB, respectively, first and second pull-down devices connected between the first and second output nodes OTB and OCB and the ground voltage, and a pull up amplifier 94 (which comprises two PMOS transistors 91, 92), connected between the first and second output nodes OTB and OCB, for latching the voltage level of the output node OTB, OCB to a pull up level. The first and second pull-down devices comprises N-MOS transistors 98, 102 for receiving the delayed complement sampling clock signal CLK 2, and N-MOS transistors 96, 100 for receiving outputs of the first and second input/output nodes of the clocked sampled amplifier 105.

As shown in FIG. 3A, if the main clock CLKB is a first sate, for example, logic "high", the complement main clock CLK is logic "low", the delayed sampling clock CLKB2 is logic "high", and the delayed complement sampling clock CLK2 is "low".

When an external signal Vi having a small swing width is input at the first state of the main clock CLKB, the pass gates 64, 66 of the clocked sampled amplifier 105 turn on, and the first and second input/output nodes OUT and OUTB have the voltage levels of the external signal Vi and the reference signal Vref, respectively.

If the main clock CLKB transitions from the first state to a second state, i.e., from logic "high" to logic "low", the complement main clock CLK becomes logic "high" and the PMOS transistor 82 and the NMOS transistor 84 turn on. As a result, the P-type sense amplifier 74 and N-type sense amplifier 80 amplify the voltage difference between the first and second input/output nodes OUT and OUTB. For instance, the P-type sense amplifier 74 will amplify a greater signal of the input/output nodes OUT and OUTB, and the N-type sense amplifier 80 will amplify a less signal of the input/output nodes OUT and OUTB.

After the state transition of main clock CLK, i.e., from high to low, if the delayed sampling clock CLKB2 transitions from logic "high" to logic "low" in a predetermined time, the two pass gates 64, 66 turn off and the amplified signals are sampled by the sense amplifies 74, 84. The sampled signals are amplified up to a CMOS level, i.e., the power source voltage Vdd and the ground voltage Vss (See OUT and OUTB in FIG. 3B.).

The clocked and sampled amplifier 105, unlike the conventional input receiver described above, does not pre-charge the output signal, but quickly amplifies the voltage difference between the external signal Vi and the reference signal Vref because outputs of the first and second input/output nodes OUT and OUTB already have a voltage difference before being latched by the P-type sense amplifier 74 and the N-type sense amplifier 80. The time for amplifying the voltages of the first and second input/output nodes OUT and OUTB up to the power source voltage Vdd and the ground voltage Vss, respectively, depends on the positive feedback operation of the P-type sense amplifier 74 and the N-type sense amplifier 80. Because the speed of the positive feedback operation is insignificantly affected by an initial voltage level of the input/output nodes OUT and OUTB, there is little speed push in receiving an external signal Vi having a small swing.

After amplified up to the CMOS level, the signal Vi is input to the clocked pulse generator 110. The delayed complement sampling clock CLK2, which enables the clocked pulse generator 110, is activated when the voltage values of the first and second input/output nodes OUT and OUTB are amplified to the power source voltage Vdd and the ground voltage Vss, respectively. That is, the delayed complement sampling clock CLK2 becomes logic "high" when the delayed sampling clock CLKB2 becomes logic "low".

If the delayed complement sampling clock CLK2 becomes logic "high", the PMOS transistors 86, 88 (which receive the signal CLK2) turn off, and the NMOS transistors 98, 102 (which are connected to the signal CLK2) turn on. As a result, because the power source voltage Vdd is cut off, the pre-charge operations of the first and second output nodes OTB and OCB stop and the clocked pulse generator 110 is enabled to generate pule type signals.

With the activation of the clocked pulse generator 110, if the amplified signals OUT, OUTB are input to gates of the two NMOS transistors 96, 100, the NMOS transistors 96, 100 selectively pull down one of the outputs of the first and second output nodes OTB, OCB in response to the voltage difference Vgs between the gate and the source of the NMOS transistors 96, 100, as shown in FIG. 3C. That is, if the delayed sampling clock CLKB2 transitions from logic "high" to logic "low", only one of the first and second output signals OTB, OCB (which are pre-charged to a level of the power source voltage Vdd) transitions to logic "low" as shown in FIG. 3C. For example, if the first input/output node OUT is amplified and sampled to "high", the first output node OTB is pull down and output as a pulse signal as shown in FIGS. 3B and 3C. Accordingly, the clocked pulse generator 110 generates one of the first and second output nodes OTB, OCB as a low pulse signal in response to levels of the delayed complement sampling clock CLK2 and the external data.

If the main clock CLKB again transitions from logic "low" to logic "high", the clocked pulse generator 110 finishes the pulse generation operation of the external signal Vi, and the first and second output nodes OTB, OCB are pre-charged to a level of the power source voltage Vdd by the pull up amplifier 94.

The drivers 104, 106, connected to the first and second output nodes OTB, OCB of the clocked pulse generator 110, supply the pulse type signals from the clocked pulse generator 110 to an internal circuit of a semiconductor device.

Although the present invention is described by using an embodiment, the present invention is not limited to the embodiments. For example, the reference signal may be an external reference voltage or an internally generated voltage. The reference signal Vref and the external signal Vi are not absolutely discriminated by their input terminals. In addition, although the clock signal is discriminated by the phase and complement clock signals, it should be noted that these also may be changed or varied or modified.

While the invention has been described in terms of preferred embodiments, those skilled in the art will recognize that the invention can be practiced with modification within the sprit and scope of the appended claims. For example, the PMOS transistor may be replaced with the NMOS transistor, the power source voltage with ground voltage, and vice versa. In addition, the high speed input receiver of the present invention is not only applied to receiving and converting of an input signal in a semiconductor memory device, but also may be applied to other applications.

What is claimed is:

1. A receiver, comprising:
   a clock sampled amplifier comprising first and second input/output nodes for receiving an external signal and a reference signal, respectively, in response to a first state of a clock signal and a delayed sampling clock signal, and for amplifying and sampling the voltage difference between the external signal and the reference signal, respectively, in response to a transition of the clock signal and the delayed sampling clock signal to a second state; and
   a pulse generator comprising first and second output nodes connected between a power source voltage and a ground voltage, for pre-charging the first and second output nodes in response to the first state of the delayed sampling clock signal, and for selectively pulling down one of outputs of the first and second output nodes to a level of the ground voltage to generate a pulse signal, in response to the second state of the delayed sampling clock signal and outputs of the first and second input/output nodes of the clock sampled amplifier.

2. The receiver of claim 1, further comprising a clock generator comprising a plurality of inverters for generating the clock signal and the delayed sampling clock signal.

3. The receiver of claim 1, wherein the second state of the clock and the delayed sampling clock signals are complementary state of the first state of the clock and the delayed sampling clock signals, respectively.

4. The receiver of claim 1, wherein the clock sampled amplifier samples the amplified signal in response to the second state of the delayed sampling clock signal, after amplifying the voltage difference between the external signal and the reference signal.

5. The receiver of claim 1, wherein the clock sampled amplifier further comprises:
   a latched amplifier, connected between the first and second input/output nodes, for sensing and amplifying the voltage difference between the external signal and the reference signal when the clock signal transitions from the first state to the second state; and
   first and second pass gates, connected to the first and second input/output nodes, respectively, for receiving the external signal and the reference signal in response to the first state of the delayed sampling clock signal.

6. The receiver of claim 5, wherein the latched amplifier comprises a P-type sense amplifier and a N-type sense amplifier connected between the first and second input/output nodes, respectively, a first amplification driver connected between the P-type sense amplifier and the power source voltage, and a second amplification drivers connected between the N-type sense amplifiers and the ground voltage.

7. The receiver of claim 5, wherein each of the first and second pass gates comprises a transmission gate, wherein the transmission gate comprises a PMOS transistor for receiving the first state of the delayed sampling clock signal and an NMOS transistor for receiving the second state of the delayed sampling clock signal, wherein the PMOS transistor and the NMOS transistor are connected to each other with channels in parallel.

8. The receiver of claim 6, wherein the first amplification driver comprises a PMOS transistor for receiving the first state of the clock signal to drive the P type sense amplifier, and the second amplification driver comprises a NMOS transistor for receiving the second state of the clock signal to drive the N type sense amplifier.

9. The receiver of claim 1, wherein the pulse generator further comprises:
   first and second pre-charge devices, connected between the power source voltage and the first and second output nodes, for pre-charging the first and second output nodes to a level of the power source voltage in response to the first state of the delayed sampling clock signal;
   first and second pull-down devices, connected between the first and second input/output nodes in the clock sampled amplifier and the first and second output nodes, for inverting one of the outputs of the first and second output nodes in response to the second state of the delayed sampling clock signal and the outputs of the clock sampled amplifier; and
   a pull-up amplifier, connected between the first and second output nodes, for pulling up one of the outputs of the first and second output nodes having a higher output voltage.

10. A method for converting an external signal into an internal signal of pulse type in a semiconductor device, the method comprising the steps of:
    receiving the external signal and a reference signal in response to a first state of a clock signal and a delayed sampling clock signal;
    amplifying the voltage difference between the external signal and the reference signal to generate two amplified signals in response to a transition of the clock signal to a second state,
    pre-charging a power source voltage to generate two output signals in response to the first state of the delayed sampling clock signal; and
    generating a pulse signal by pulling down one of the output signals in response to the amplified signals and a transition of the delayed sampling clock signal to a second state.

11. The method of claim 10, further comprising the step of generating the first and the second states of the clock and the delayed sampling clock signals by inverting the clock signal and the delayed sampling clock signals, respectively.

12. The method of claim 10, wherein the step of amplifying the voltage difference comprises the step of sampling the amplified signals in response to the second state of the delayed sampling clock signal.

* * * * *